Nov. 16, 1965 D. R. AYER 3,218,584

STRIP LINE CONNECTION

Filed Jan. 2, 1964 2 Sheets-Sheet 1

INVENTOR.
DONALD R. AYER

BY

Nov. 16, 1965 D. R. AYER 3,218,584

STRIP LINE CONNECTION

Filed Jan. 2, 1964 2 Sheets-Sheet 2

INVENTOR.
DONALD R. AYER

BY Louis Etlinger

United States Patent Office 3,218,584
Patented Nov. 16, 1965

3,218,584
STRIP LINE CONNECTION
Donald R. Ayer, Nashua, N.H., assignor to Sanders Associates, Inc., Nashua, N.H., a corporation of Delaware
Filed Jan. 2, 1964, Ser. No. 335,288
15 Claims. (Cl. 333—84)

The present invention relates to the art of high frequency transmission lines. More specifically, it relates to a connector assembly for physically incorporating and electrically coupling an electrical component in a section of strip transmission line. The character of the physical co-operation between the connector assembly and the strip line section of which the component is a part is such that the component may be removably inserted into the line and, while so located, it provides circuit continuity through the connector region. The assembly is so constructed that the characteristic impedance of the strip line section in which it is incorporated is preserved.

The introduction of components such as resistors, capacitors, diodes and transistors into microwave circuitry has, in the past, created many special problems. These problems are due, primarily, to the particular construction of microwave circuitry necessitated by the extremely high frequency signals which the circuitry must carry. Transmission elements in the form of wave guides, coaxial lines and strip lines are commonly used in microwave systems.

A technique previously used to introduce components into microwave circuitry is to provide a separate housing or capsule for the component, with leads brought out to electrically couple the component to other parts of the system. This technique has the advantage that the components can be readily replaced but suffers from the disadvantage that the leads give rise to appreciable inductive and capacitive reactance; this contributes to a difficult impedance matching problem. Moreover, the resultant structure is often unduly space consuming.

With the advent of miniaturized components and strip line circuitry, it has become possible to package components within the transmission line itself, thereby substantially overcoming the problems of lead reactances and bulkiness. However, in many cases this has caused replacement of components to become a time consuming and laborous task. To remove the component once the line is assembled, considerable cutting, trimming, splicing, and soldering may be required.

This problem is even more acute in the laboratory, where microwave circuits and their incorporated components are subjected to tests and evaluations. A strip line system may be constructed for a specific test procedure and, at the conclusion of the required testing and evaluation, may have little or no further utility, because of the rather permanent nature of the component-strip line combination. This materially adds to the cost as well as the time required to set up experimental apparatus, since the circuit must be constructed wholly from scratch for each component to be evaluated.

A collateral problem in this area is one of matching the impedance of the component to that of the strip line section in which the component is incorporated. Where miniaturized components are used, it is often necessary to materially reduce the width of the inner conductor strip in order to make contact with the component from several directions. This gives rise to an impedance mismatch. The problem is readily appreciated when one considers that some transistor dies are of the order of a few thousandths of an inch in size. As a consequence, it is necessary to vary one or more other parameters of the transmission line in order to maintain a substantially uniform characteristic impedance up to and including the component. This problem is particularly complicated when it is desired to interchange components or to substitute one type for another, as may be required in experimental apparatus.

That is, apart from the fact that components in previously proposed arrangements have not been readily removable from the line from a purely physical standpoint, substantial physical modification of the strip line sections may be required in order to maintain an impedance match as components of various types are substituted for each other.

It is therefore an object of the present invention to provide a system for removably incorporating a component in a strip transmission line section.

A further object is to provide a transmission line assembly having a component disposed therein which may readily be removed and which may be interchanged with other components without requiring physical modification of the assembly.

An additional object is to provide a modular component in the form of a strip line connector assembly which may be removably inserted in a strip line section and is so constructed as to provide a substantial impedance match between the connector and the other portions of strip line section.

A still further object is to provide a modular component in the form of a connector assembly by means of which a component may be removably inserted in a strip line section, while achieving substantial shielding of the connections to the component from high frequency energy and thereby providing latitude in the position of the component.

Other objects of the invention will in part be obvious and will in part appear hereinafter.

The invention accordingly comprises the features of construction, combinations of elements, and arrangements of parts which will be exemplified in the constructions hereinafter set forth and the scope of the invention will be indicated in the claims.

For a fuller understanding of the objects of the invention, reference should be had to the following detailed description taken in connection with the accompanying drawings, in which.

Figure 1:
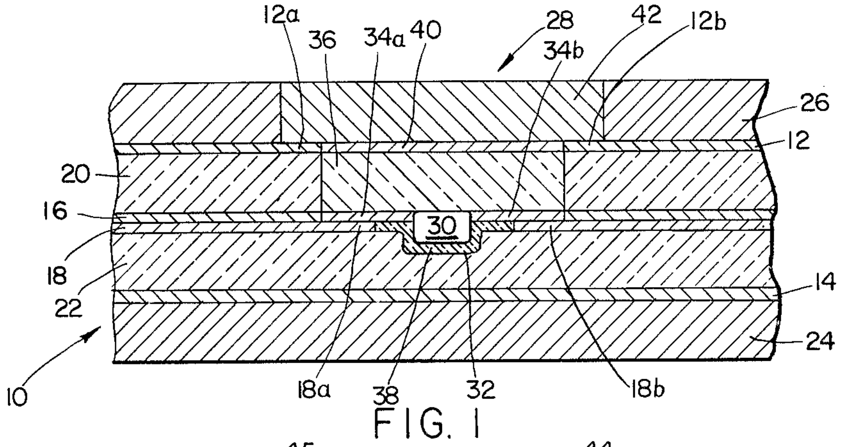
FIG. 1 is a longitudinal section showing the connector as incorporated in a strip line section.

The invention has specific application in strip transmission lines. Strip lines are constructed in a well-known manner, generally with a pair of spaced-apart ground plane conductors and one or more intermediate central conductor strips. The central conductor strips are maintained centrally disposed between the ground planes by the inclusion of dielectric material between them. Transmission lines of this type are more fully disclosed in U.S. Patent No. 2,810,892 issued October 22, 1957, to Daniel Blitz for "Transmission Line." The connector assembly embodying the invention provides a support or package for an electrically passive component or an electrically controllable active component such as a transistor or diode, which is to be electrically connected to and physically incorporated in a strip transmission line section.

In order to accommodate the connector assembly and the electrical component mounted thereon, a portion of the strip line section is cut away to provide an interfitting socket. To provide circuit continuity through the portion of the transmission line containing the connector, the connector assembly is constructed to provide, upon insertion, those portions of the strip line conductors which were removed to accommodate the assembly.

For example, where portions of the central conductor strips and the ground plane conductors, along with portions of the intermediate dielectric material, are removed to form a connector socket, the connector assembly is constructed with central conductor strip segments, segments of ground plane conductors and intermediate dielectric material necessary to fill the connector socket. These parts are designed to avoid an impedance mismatch at the point of insertion. The electrical component included in the connector assembly makes appropriate contact with the inner conductor strip segments and if desired, the ground plane conductors carried by the connector. Electrical connection of the connector-mounted component to the strip line section is ensured by providing conductive paths in the connector which overlap the corresponding conductors of the strip line section.

The connector may be readily designed to achieve an impedance match with the strip line section. In situations where the inner conductor strip segments of the connector assembly must be reduced in width in order to ensure good electrical contact with the component from several directions, the resultant change in the characteristic impedance of the connector may be offset by changing the dielectric constant of the dielectric material or other parameters of the assembly in order to maintain a substantially constant characteristic impedance throughout the strip line section in which the connector is inserted.

Thus, a plurality of connector assemblies may be designed to have the same characteristic impedance and physical dimensions when different types of components are included in them and as a result, they may be interchanged, one for the other, in a particular strip line section.

More specifically, in FIG. 1, I have shown in cross-section a strip line section 10 which includes a pair of ground plane conductors 12 and 14 and a pair of inner conductor strips 16 and 18 spaced from the ground plane conductors by layers 20 and 22 of dielectric material. It will be appreciated that the relative dimensions of the various parts have been exaggerated for the purposes of illustration. The section 10 is housed between a base member 24 and a cover member 26. A connector assembly 28, carrying an electrical component 30, is shown physically incorporated in the strip line section 10.

In order to accommodate the assembly 28, differential portions of the inner conductor strips 16 and 18 of the section 10 are removed, leaving exposed end portions **18*a* and 18*b* of strip 18. A recess 32 in the dielectric layer 22 accommodates the component 30. Portions of the dielectric layer 20, the ground plane conductor 12 and the cover member 26 are also removed to provide a socket containing the connector 28. Enough of the cover member 26 is removed to expose end portions 12*a* and 12*b* of ground plane 12** on opposite sides of the socket.

Figure 2:
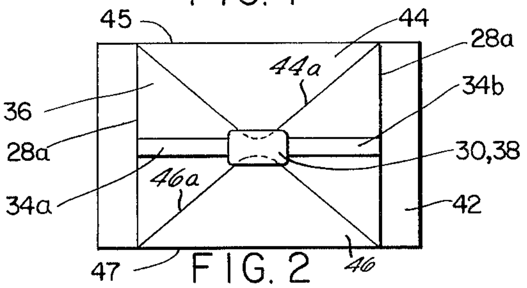
FIG. 2 is a bottom view of the connector apart from the strip line section.

The connector assembly 28, as seen in FIGS. 1 and 2, includes a pair of inner conductor strips **34*a* and 34*b* which extend inwardly from the edges 28*a* of the connector toward the component 30 and make connection therewith at their respective inner ends. The strips 34*a* and 34*b*, along with the component 30, are mounted on the bottom surface of a dielectric segment 36 which corresponds in size and shape to the portion of layer 20 of dielectric material removed from the strip line section 10. A protective cap 38 of dielectric material (not shown) serves to hold the component 30 in place as well as to hermetically seal it to the surface of dielectric segment 36. A ground plane conductor segment 40 (FIG. 1) is affixed to the top surface of the segment 36 to complete the connector package. A metallic cover member 42, which may be a separate member or may be bonded to and thus a part of the assembly 28, closes off the socket in strip line section 10 once the connector 28** is inserted therein.

It may be desired to provide a ground connection for the component 30 and this can be readily accomplished by providing conductive films 44 and 46 on the surface of the dielectric 36 as seen in FIG. 2. The films 44 and 46 extend from the component 30 over the bottom surface of the dielectric segment 36 and thence over its lateral edge surfaces 45 and 47 to connect with the ground plane conductor 40 on the top surface of the segment 36.

As best seen in FIG. 1, insertion of the connector assembly 28 into the strip line brings inner conductor strips **34*a* and 34*b* into overlapping engagement with the exposed end portions 18*a* and 18*b* of inner strip 18. The component 30 and protective cap 38 nest in the recess 32 provided in the dielectric layer 22. The gaps separating the ground plane conductor 12 of the strip line section 10 from the segment 40 of the assembly 28 are bridged by the electrically conductive cover member 42 which overlies both the exposed end portions 12*a* and 12*b* of ground plane 12 of the section 10 and the segment 40** to provide ground plane continuity.

The cover member 42 is preferably affixed to the strip line section 10 by screws or other fastening means capable of providing the necessary pressure to ensure good electrical contact between the various conductor members of the assembly 28 and the section 10.

It will be appreciated that once the connector assembly 28 is inserted into the section 10, the inner strips **34*a* and 34*b* and the ground plane segment 40 provide continuity of the strip transmission line itself. Accordingly, the strips 34*a* and 34*b*, which serve as leads for the component 30, do not give rise to reactive components which, at high frequencies, would otherwise tend to produce an impedance mismatch between the transmission line and the connector assembly 28**.

The ground connections for the component 30 provided by the films 44 and 46 are likewise relatively free of impedance mismatch problems. The films extend laterally from the component 30 (FIG. 2) in the plane of the inner conductor strips **34*a* and 34*b*, where the high frequency field has a minimum value. Furthermore, the films 44 and 46 pass around the edges of the dielectric segment 36 along the surfaces 45 and 47 at a sufficient distance from the strips 34*a* and 34*b* that the field in this region is substantially zero. The films have sufficient width to minimize their inductive reactances at the frequencies encountered in operation. They are tapered toward a lesser width at the component 30, corresponding to the size of the component or the parts thereof connected to the films. These tapers, shown at 44*a* and 46*a* in FIG. 2, also serve to isolate the films from the strips 34*a* and 34*b***.

In some situations the conductor strips **34*a* and 34*b* of the connector assembly 28 may preferably be reduced in width as compared with the strips 16 and 18, in order to facilitate connection with the component leads and also to reduce further the capacitive coupling between the strips 34*a* and 34*b* and the films 44 and 46. The strip portions 18*a* and 18*b* may be similarly reduced. In such cases the dielectric segment 36 and the portion of the dielectric layer 22 opposite it may be fabricated from a material having a different dielectric constant than the dielectric layer 20 and the remainder of the layer 22. By this provision, changes in the characteristic impedance of the section 10 at the point of insertion of the assembly 28 resulting from this reduction in inner conductor width may be offset by the difference in dielectric constant. The result is a uniform characteristic impedance throughout the strip line section 10**.

It will be appreciated that the other parameters of the strip line section 10 in the region of the connector assembly 28 may be varied to achieve uniform characteristic impedance. Thus, the spacing between inner conductor strips and ground plane conductors may be altered in such manner that the end result is a constant characteristic impedance.

To increase the power handling ability of the component 30, it may be desirable to provide a heat sink. This may be effectively accomplished by using beryllium oxide as the material of the dielectric layers 20 and 22, and segment 36, which surround the component 30. Beryllium oxide is both a good dielectric and a good thermal conductor. As a result, heat generated by the component during its operation is readily conducted away from the component to the cover members 26 and 42, and base member 24.

Figure 3:
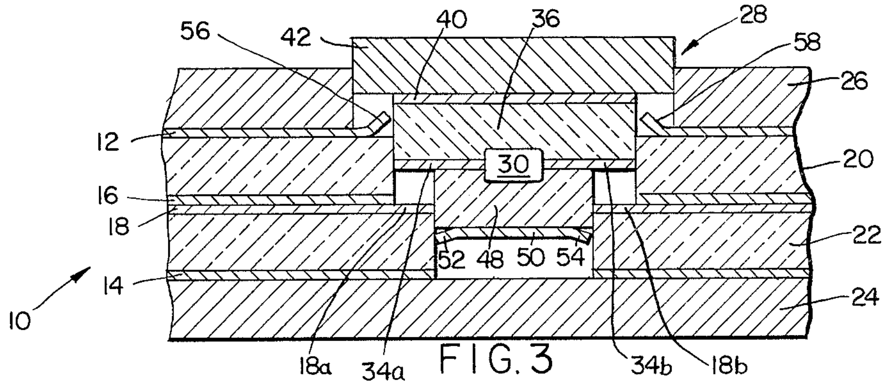
FIG. 3 is a view, similar to FIG. 1, of a modified connector incorporated in a strip line section.

In FIG. 3, I have shown a second embodiment of my invention in which parts corresponding to those in FIGS. 1 and 2 are given corresponding reference numerals. Thus, as described in connection with FIG. 1, FIG. 3 depicts a strip transmission section 10 having ground plane conductors 12 and 14, inner conductor strips 16 and 18 and intermediate dielectric layers 20 and 22. The section 10 is housed between base member 24 and cover member 26.

Figure 4:
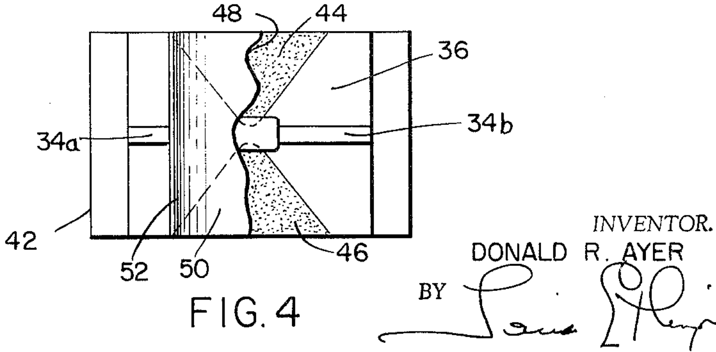
FIG. 4 is a top view partially broken away showing the modified connector of FIG. 3 apart from the strip line section.

The primary difference between the embodiments of FIGS. 1 and 2 and the embodiment of FIGS. 3 and 4 is that in addition to removing portions of the strips 16 and 18, dielectric layer 20 and ground plane conductor 12 from the section 10, portions of the dielectric layer 22 and ground plane conductor 14 are also removed to provide the socket for the insertion of the connector assembly 28.

The connector assembly 28, as seen in both FIGS. 3 and 4, thus includes a dielectric segment 48 and a ground plane segment 50 bonded to the bottom surface thereof, both of which correspond in size and shape to the removed portions of ground plane conductor 14 and dielectric layer 22. The component 30 is encapsulated between the segments 48 and 36, thus obviating the need for the protective cap 38 of FIGS. 1 and 2.

In order to ensure electrical contact across the gaps between the conductors of the strip line section 10 and the corresponding conductors carried by the connector assembly 28, the end portions of the ground plane conductor 50 carried by the connector assembly 28 are bent downwardly to form spring tabs 52 and 54. Similarly, the end portions of the ground plane conductor 12 on opposite sides of the connector assembly 28 are bent upwardly to form spring tabs 56 and 58. As the connector assembly 28 is inserted into the socket formed in the strip line section 10, the spring tabs 52, 54, 56 and 58 are flattened as they engage base member 24 and connector cover member 42, respectively. This ensures good electrical contact with the members 24 and 42, which bridge the gaps between ground plane conductors 12 and 14 in the strip line section 10 and the ground plane segments 40 and 50 carried by the assembly 28.

As in the embodiment of FIGS. 1 and 2, conductive films 44 and 46 may be provided for ground connections between the ground plane conductor 40 and/or 50 and the component 30. In FIG. 4, the right hand portion of the dielectric layer 48 is broken away to expose the entire inner conductor strip **34*b*, the films 44 and 46, and the component 30 carried on the lower surface of dielectric segment 36**.

Figures 5, 6, 7, 8, 9, 10, 11:
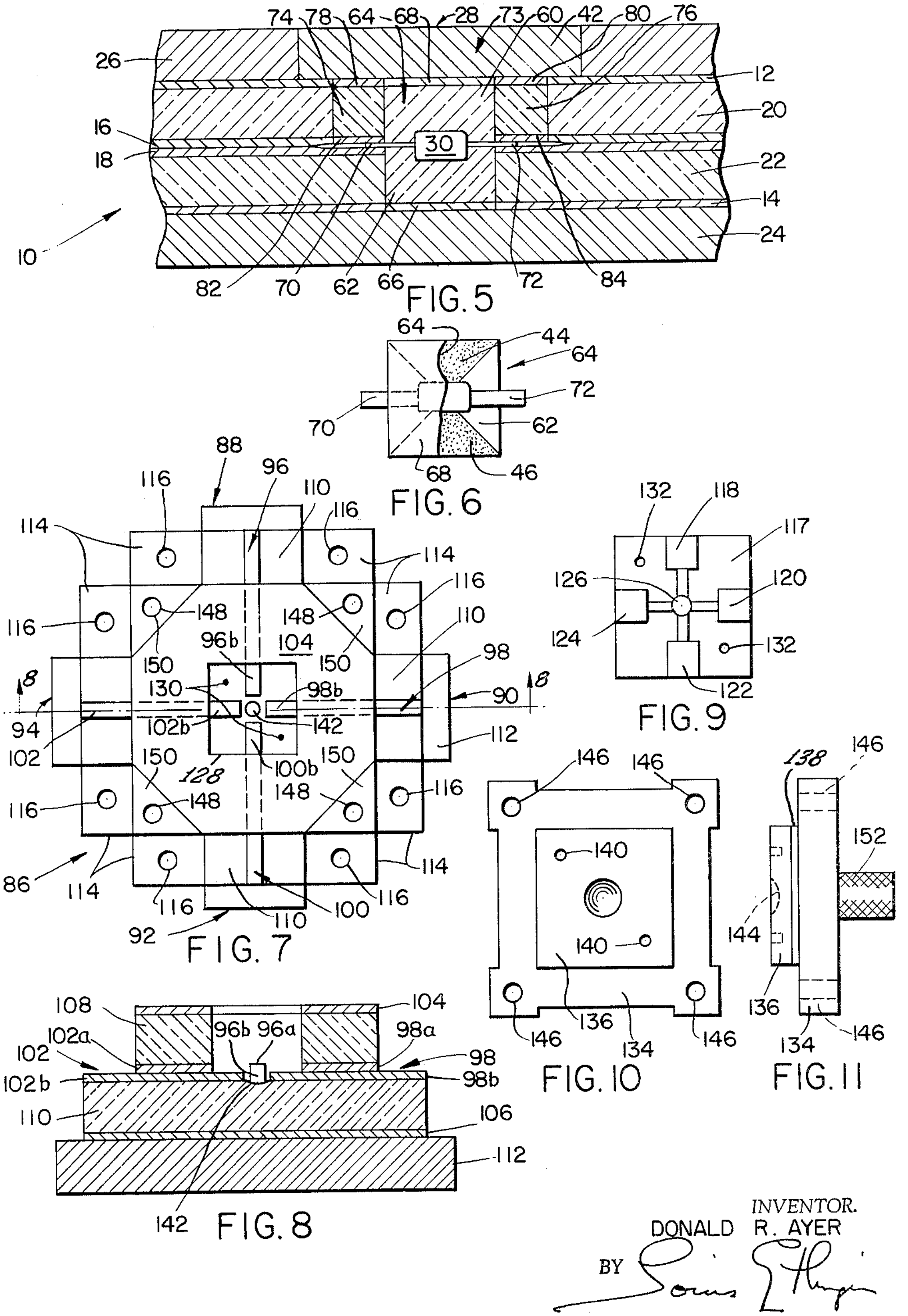
FIG. 5 is a view, similar to FIG. 1, of another embodiment of the invention.
FIG. 6 is a top view, partly broken away, of the packaged component included with the connector of FIG. 5.
FIG. 7 is a top view of a strip line module constructed to receive a connector.
FIG. 8 is a view taken along lines 8—8 of FIG. 7.
FIG. 9 is a bottom view of a component card which is received in the module of FIG. 7.
FIG. 10 is a bottom view of the cover assembly used in the module of FIG. 7.
FIG. 11 is a side view of the cover of FIG. 10.

FIGS. 5 and 6 illustrate a strip line section 10 including a pair of ground plane conductors 12 and 14 and a pair of inner conductors 16 and 18 spaced from the ground plane conductors by dielectric layers 20 and 22, as in the previous embodiments. The primary difference in the structure of FIGS. 5 and 6 is that the connector assembly 28 is made up of two parts. The component 30 is encapsulated between dielectric segments 60 and 62 to provide a component assembly generally indicated at 64. The bottom surface of segment 62 and the top surface of segment 60 support ground plane conductor segments 66 and 68, respectively. Inner conductor strips 70 and 72 extend beyond the ends of the assembly 64 to facilitate connection to the overlapping inner conductors 16 and 18 of the strip line section 10.

As shown in FIG. 5, a second part of the connector assembly 28 is a cover unit 73 comprising dielectric segments 74 and 76, bonded to ground plane segments 78 and 80. The latter are secured to the cover member 42. The unit 73 also includes inner conductor segments 82 and 84, on the bottom surfaces of the dielectric segments 74 and 76

To assemble the connector assembly 28 of FIG. 5 with the strip line section 10, the component assembly 64 is first inserted. The cover unit 73 is then inserted with the dielectric segments 74 and 76 surrounding the assembly 64 to position as well as enclose it in the strip line section 10. The inner conductor strips 70 and 72 protruding from the component assembly 64 are sandwiched between the inner conductor 18 of the strip line section 10 and the inner conductor segments 82 and 84 carried by the cover unit 73, thereby assuring good electric contact. The base member 24 and cover member 42 provide bridging means ensuring completion of the ground plane circuit through the ground plane segments 66, 68, 78 and 80.

As shown in FIG. 6 the component assembly 64 may be provided with conductive films 44 and 46 bonded to either or both of the opposing surfaces of dielectric segments 60 and 62 and extending over corresponding edge surfaces to make a ground connection between the component 30 and the ground planes 66 and/or 68.

The embodiment of FIGS. 5 and 6 has the advantage that since the strips 70 and 72 are sandwiched between spaced inner conductor strips, a Faraday shield is provided to mask their presence. Since these strips are thus shielded from RF energy, their shape and registration is relatively unimportant as long as they do not protrude beyond the strips 18, 82 and 84 in the transverse direction. Thus, the strips 70 and 72 may conveniently be in the form of ribbon leads of the component 30.

In FIGS. 7 and 8, I have shown a strip line module, generally indicated at 86, adapted to receive a connector assembly constructed in accordance with my invention. The module 86 is provided with junctions, indicated at 88, 90, 92 and 94, at which additional strip line modules may be attached to form a high frequency circuit. The manner of attachment at the various junctions 88–94 is disclosed in U.S. Patent No. 3,015,081 for "Transmission Line Modular Unit," issued to the present applicant on December 26, 1961. Inner conductors 96, 98, 100 and 102 extend inwardly from the junctions 88–94 to points just short of the center of the module 86. As more clearly seen in FIG. 8, the conductors 98 and 102 comprise dual strips **98*a*, 102*a*, and 98*b* and 102*b*. The conductors 96 and 100** are similarly constructed. As in the foregoing embodiments of the invention, the strips in each inner conductor are in direct electrical contact with each other.

The inner conductors 96–102 are bonded to dielectric layers 108 and 110 and centrally disposed between an upper ground plane conductor 104 and a lower ground plane conductor 106. A metallic base member 112, which forms a part of the housing for module 86, is provided with upright posts 114 (FIG. 7) positioned on opposite sides of the junctions 88–94. The posts 114 are provided with holes 116 which facilitate the attachment of other strip line modules at the various junctions in accordance with the above-cited Patent No. 3,015,081.

In FIG. 9, I have shown a component card 117 of dielectric material to which conductor strip segments 118, 120, 122 and 124 are bonded. The inner ends of segments 118–124 are reduced in width to make contact with a component 126 also affixed to the card 117. It is seen that this reduction in width permits contact with the component without undesirable contact or close capacitive coupling between the segments 118–124. In accordance with the technique described above, the material of the inner part of the card 117 may differ from the outer part of the card, with the dielectric constants of the two parts being proportioned to provide a constant characteristic impedance all the way into the component 126.

Returning to FIG. 7, a socket 128 is provided in the module 86 for the component card 117, which is sized to fit the socket. To form the socket 128, the central portions of the ground plane conductor 104, strips **96*a*–102*a* and dielectric layer 108 are removed, thereby exposing strips 96*b*–102*b*. Guide pins 130, positioned in the socket 128, engage guide holes 132 in the component card 117 in order to ensure registry of the conductor strip segments 118–124 on the component card 117 with the central conductor strips 96*b*–102*b* of the module 86. Accordingly, when the card 117 is inserted into the socket, the segments 118–124 are in face-to-face contact with the strips 96*b*–102*b*, thereby in effect forming extensions of the strips 96*a*–102*a***.

A cover member 134, shown in FIGS. 10 and 11 is used to enclose the card 117 and component 126 in the socket 128. A block 136 of dielectric material, having a ground plane 138 bonded to one surface thereof is affixed to the undersurface of the cover 134. The dimensions of the dielectric block 136 and the ground plane conform closely to the removed central portions of ground plane 104 and dielectric layer 108 of the module 86 (FIG. 7). (For illustrative purposes, the sizes of the component card 117 and the parts 134, 136 and 138 have been exaggerated in relation to the size of the module 86.)

Guide holes 140 may be provided in the dielectric block 136 (FIG. 10) to engage the guide pins 130 (FIG. 7) and thus ensure proper positioning of the cover 134 in the socket 128. Slight indentations 142 and 144 in dielectric layer 110 (FIGS. 7 and 8) and in dielectric block 136 (FIGS. 10 and 11), respectively, are provided to accommodate component 126. Holes 146 in the cover 134 register with holes 148 (FIG. 7) provided in upright posts 150 extending from the base 112 in order that the cover may be tightly clamped in position by bolts (not shown). As seen in FIG. 11, a handle 152 may be attached to the cover 134 to facilitate manipulation of the cover into and out of socket 128. As in previous embodiments, the cover member 134 serves to bridge the gap between ground plane 104 of module 86 and ground plane 138 affixed to member 134.

Although the various embodiments of the invention show the component-carrying members as rectangular in shape, obviously other shapes may be resorted to. For example, they may be round and thus be received in round sockets provided in the strip line sections. Where no ground connection for the component is required, the conductive coatings 44 and 46 (FIGS. 2 and 4) may be eliminated.

It should be understood that the principles of the invention may also be utilized to advantage in constructing a connector assembly for insertion in a strip line section having a single inner conductor strip. In such cases, the inner conductor strip segments carried by the connector simply overlap the ends of the inner conductor on opposite sides of the socket. Although the dual inner conductor strips are preferred, the single strips are satisfactory in most situations. For example, in a 50 ohm strip line with a ground plane conductor spacing of ⅛", the impedance mismatch is about 0.6% if the ground plane conductor spacing is maintained constant in the connector assembly region as shown in the drawings.

If the ground plane conductor spacing is increased by the amount of the thickness of the inner conductor strip because of the overlapping of segments of a single strip inner conductor, the impedance mismatch is approximately 1.6%.

It will be appreciated that a plurality of electrical components may be packaged in a single connector for insertion in a strip transmission line section. Moreover, although the provision of a heat sink is disclosed specifically in connection with the embodiment of FIGS. 1 and 2, it will be appreciated that this feature may be readily incorporated in the other embodiments. By the same token, variations in the parameters of the connector assembly structure, to achieve a matched impedance condition at the point of insertion in the strip line section while changing inner conductor width, may be resorted to in all of the disclosed embodiments of the invention. In addition, the spring tabs of FIGS. 3 and 4 may well be utilized in all of the embodiments to ensure ground plane circuit continuity.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention which, as a matter of language, might be said to fall therebetween.

Having described my invention, what I claim as new and desire to secure by Letters Patent is:

1. A replaceable strip line connector assembly for insertion in a socket provided in a strip transmission line section, said strip transmission line having first and second ground plane conductors, an inner conductor, and first and second dielectric layers separating said inner conductor from said ground plane conductors, said assembly comprising (a) an electrical component, (b) inner conductor strip segments contacting said component and forming leads therefor, (c) means forming a ground plane conductor, and (d) a dielectric segment interposed between said inner conductor strip segments and said ground plane conductor, said inner conductor strip segments being adapted to mate with and effect a continuation of said strip transmission line inner conductor upon insertion of said connector assembly into said socket, said means forming a ground plane conductor being adapted to mate with and effect a continuation of one ground plane conductor of said strip transmission line upon insertion of said connector into said socket, and said dielectric segment being adapted to mate with and effect a continuation of the dielectric layer of said strip transmission line residing between the inner conductor and said last-mentioned ground plane conductor upon insertion of said connector assembly into said socket, whereby upon insertion of said connector into said socket provided in said strip transmission line section, said component is electrically coupled to and physically incorporated into said strip transmission line circuit without substantially affecting the characteristic impedance of said strip transmission line section.

2. The assembly claimed in claim 1 which further includes a connection between said component and said ground plane conductor.

3. The assembly claimed in claim 2 wherein said ground connection comprises a conductive coating applied to the surface of said dielectric segment between said component and said ground plane conductor.

4. The assembly claimed in claim 1 which further includes means for hermetically sealing said component along a surface of said dielectric segment.

5. The assembly claimed in claim 4 wherein said sealing means comprises a second dielectric segment.

6. In a strip transmission line section having first and second ground plane conductors, at least one inner conductor strip, and first and second dielectric layers for maintaining said inner conductor strip disposed between said first and second ground plane conductors, the combination of (a) means forming a socket corresponding to the removal of at least
  (1) a portion of said inner conductor strip,
  (2) a portion of a first one of said ground plane conductors, and
  (3) a portion of the dielectric layer disposed between said strip and said first ground plane conductor,
(b) a strip line connector assembly comprising
  (1) an electrical component,
  (2) inner conductor strip segments contacting said component and forming leads therefor,
  (3) a ground plane condutcor segment conforming in size to said portion of said first ground plane conductor, and
  (4) a dielectric segment interposed between said inner strip segments and said ground plane conductor segment, said dielectric segment corresponding in size to said dielectric layer portion,
(c) whereby said connector assembly conforms to said socket, with the inner conductor strip segments of said assembly being in electrically conducting engagement with the end portions of said inner conductor strip on opposite sides of said socket.

7. The combination defined in claim 6 wherein said socket in said strip transmission line section corresponds to the removal of portions of both said first and second ground plane conductors and portions of both said first and second dielectric layer, said connector assembly further including (a) a second dielectric segment in juxtaposition with said first dielectric segment,
(b) said component being disposed between the opposing surfaces of said first and second dielectric segments, and
(c) a second ground plane conductor segment disposed on the surface of said second dielectric segment farthest removed from said component.

8. In a strip transmission line section having first and second ground plane conductors, first and second inner conductors in direct electrical contact with each other and disposed between said first and second ground plane conductors, a first dielectric layer interposed between said first ground plane conductor and said first inner conductor, and a second like dielectric layer interposed between said second ground plane conductor and said second inner conductor, means forming a socket in said strip transmission line section corresponding to the removal of portions of at least said first ground plane conductor, at least said first dielectric layer and portions of both said inner conductors; a strip line connector assembly comprising (a) an electrical component,
(b) inner conductor segments contacting said component and serving as leads therefor,
(c) a ground plane conductor segment,
(d) a dielectric segment interposed between said inner conductor segment and said ground plane conductor segment, whereby said connector, upon insertion in said socket, brings said inner conductor segments into engaging electrical contact with the end portions of said second inner conductor adjacent said socket.

9. The combination defined in claim 8 wherein said dielectric segment is formed from a material having a high thermal conductivity, thereby providing for the rapid removal of heat from the vicinity of said component.

10. The combination defined in claim 9 wherein said dielectric segment is formed from beryllium oxide.

11. The combination defined in claim 8 wherein (a) the end portions of said inner conductor segments contacting said component are of a width substantially less than the width of said inner conductors in order to facilitate contact with said component, and
(b) said dielectric segment differs from said first dielectric layer in such manner as to compensate for the alteration in the characteristic impedance of said strip transmission line section in the vicinity of said socket resulting from the lesser widths of said inner conductor segments.

12. The device of claim 11 wherein said dielectric segment has a dielectric constant different from that of said first and second dielectric layers.

13. In a strip transmission line section including first and second ground plane conductors, first and second inner conductors between and spaced from said first and second ground plane conductors by first and second dielectric layers respectively, a base member in juxtaposition with said first ground plane conductor, a cover member in juxtaposition with said second ground plane conductor, and means forming a socket in said strip transmission line corresponding to the removal of portions of said first and second ground plane conductors, said first and second inner conductors and said first and second dielectric layers, and a portion of said cover member, a strip line connector assembly comprising (a) a component unit including
  (1) a component,
  (2) a first dielectric segment encapsulating said component,
  (3) component leads connected to said component and having end portions extending from said first dielectric segment,
  (4) ground plane conductor segments disposed on opposite surfaces of said first dielectric segment,
(b) second and third dielectric segments each having a ground plane conductor segment bonded to one surface and inner conductor segment bonded to the opposite surface,
(c) a cover,
(d) said component unit fitting in said socket, with the ground plane conductor segment on one surface of said first dielectric segment contacting said base member and said component leads overlapping portions of said first inner conductor on opposite sides of said socket,
(e) said second and third dielectric segments fitting in said socket on opposite sides of said connector assembly with the inner conductor segments overlying said leads and thereby co-operating with said first inner conductor to shield said component leads therebetween,
(f) said cover fitting in said socket to retain said component unit therein and to electrically engage said second ground plane conductor on opposite sides of said socket and also to engage ground plane conductor segments of said first, second, and third dielectric segments.

14. A strip transmission line module comprising (a) a plurality of junctions at which other strip transmission line modules may be connected,
(b) first and second ground plane conductors having terminal ends at each of said junctions,
(c) a plurality of first inner conductors and a plurality of second inner conductors substantially in register with said first inner conductors,
(d) first and second dielectric layers for maintaining said first inner conductors in contact with each said second inner conductors between said first and second ground plane conductors, (e) means forming a socket formed in said module corresponding to the removal of central portions of said first ground plane conductor, said first dielectric layer, and said first inner conductors, thereby exposing portions of said second inner conductors in said socket, (f) a component card including a plurality of inner conductor segments having inner ends contacting an electrical component, (g) means disposed in said socket for positioning said component card in said socket so as to provide registration of said inner conductor segments and the exposed portions of said inner conductors, (h) a cover member including a dielectric segment and a ground plane conductor segment, and (i) said cover member fitting in said socket with said dielectric segment engaging said component card and said ground plane conductor segment aligned with said first ground plane conductor.

15. The combination defined in claim 14 wherein said positioning means comprises upright guide pins for engaging guide holes in said component card.

References Cited by the Examiner

UNITED STATES PATENTS

| | | | |
|---|---|---|---|
| 2,411,534 | 11/1946 | Fox | 333—35 |
| 2,507,692 | 5/1959 | Collard | 333—35 |
| 3,015,081 | 12/1961 | Ayer et al. | 333—84 |
| 3,142,783 | 7/1964 | Warren | 174—68.5 |
| 3,155,881 | 11/1964 | St. Jean | 333—1 |

OTHER REFERENCES

Hessinger, P., et al.: "Beryllium Oxide Dielectric Heat Sinks for Electronic Devices," in Materials and Electron Device Processing, ASTM Special Technical Publication No. 300, Philadelphia, American Society for Testing and Materials, pages 156–161.

HERMAN KARL SAALBACH, *Primary Examiner.*